United States Patent
Ohta et al.

(10) Patent No.: US 7,611,552 B2
(45) Date of Patent: Nov. 3, 2009

(54) SEMICONDUCTOR POLISHING COMPOSITION

(75) Inventors: Yoshiharu Ohta, Yamatokoriyama (JP); Yasuyuki Itai, Yamatokoriyama (JP)

(73) Assignee: Nitta Haas Incorporated, Osaka (JP)

( * ) Notice: Subject to any disclaimer, the term of this patent is extended or adjusted under 35 U.S.C. 154(b) by 140 days.

(21) Appl. No.: 10/594,480

(22) PCT Filed: Mar. 28, 2005

(86) PCT No.: PCT/JP2005/005768

§ 371 (c)(1), (2), (4) Date: Sep. 28, 2006

(87) PCT Pub. No.: WO2005/093804

PCT Pub. Date: Oct. 6, 2005

(65) Prior Publication Data

US 2007/0266640 A1    Nov. 22, 2007

(30) Foreign Application Priority Data

Mar. 29, 2004    (JP)    ............................. 2004-096849

(51) Int. Cl.
  *C09G 1/02*    (2006.01)
  *C09G 1/04*    (2006.01)
  *C09K 3/14*    (2006.01)

(52) U.S. Cl. .............................. 51/308; 106/3; 438/690; 438/691; 438/692; 438/693

(58) Field of Classification Search ........... 51/307–309; 106/3; 438/690–694
See application file for complete search history.

(56) References Cited

U.S. PATENT DOCUMENTS

| | | | |
|---|---|---|---|
| 5,116,535 A | 5/1992 | Cochrane | |
| 5,246,624 A | 9/1993 | Miller et al. | |
| 6,248,144 B1 | 6/2001 | Tamai et al. | |
| 6,352,679 B1 | 3/2002 | Shibasaki et al. | |
| 2004/0159050 A1* | 8/2004 | Pasqualoni et al. | ............ 51/307 |

FOREIGN PATENT DOCUMENTS

| | | |
|---|---|---|
| JP | 52-47369 | 4/1977 |
| JP | 03-050112 | 3/1991 |
| JP | 03-060420 | 3/1991 |
| JP | 2000-086227 | 3/2000 |
| JP | 2001-026771 | 1/2001 |
| JP | 2001-102333 | 4/2001 |
| JP | 2001-102333 A | 4/2001 |
| JP | 2001-271058 | 10/2001 |
| JP | 2001-271058 A | 10/2001 |
| JP | 2001-277106 | 10/2001 |
| JP | 2001-277106 A | 10/2001 |
| JP | 2003-188122 | 7/2003 |
| JP | 2003-188122 A | 7/2003 |

OTHER PUBLICATIONS

International Search Report dated May 6, 2005.

* cited by examiner

*Primary Examiner*—Michael A Marcheschi
(74) *Attorney, Agent, or Firm*—Harness, Dickey & Pierce, P.L.C.

(57) ABSTRACT

A semiconductor polishing composition is disclosed. The composition includes fumed silica. The semiconductor polishing composition is an aqueous dispersion solution of fumed silica. Further, the number of particles of fumed silica having a particle diameter of 0.5 μm or more is 600,000 pieces/ml or less and the number of particles of fumed silica having a particle diameter of 1 μm or more is 6000 pieces/ml or less.

4 Claims, 1 Drawing Sheet

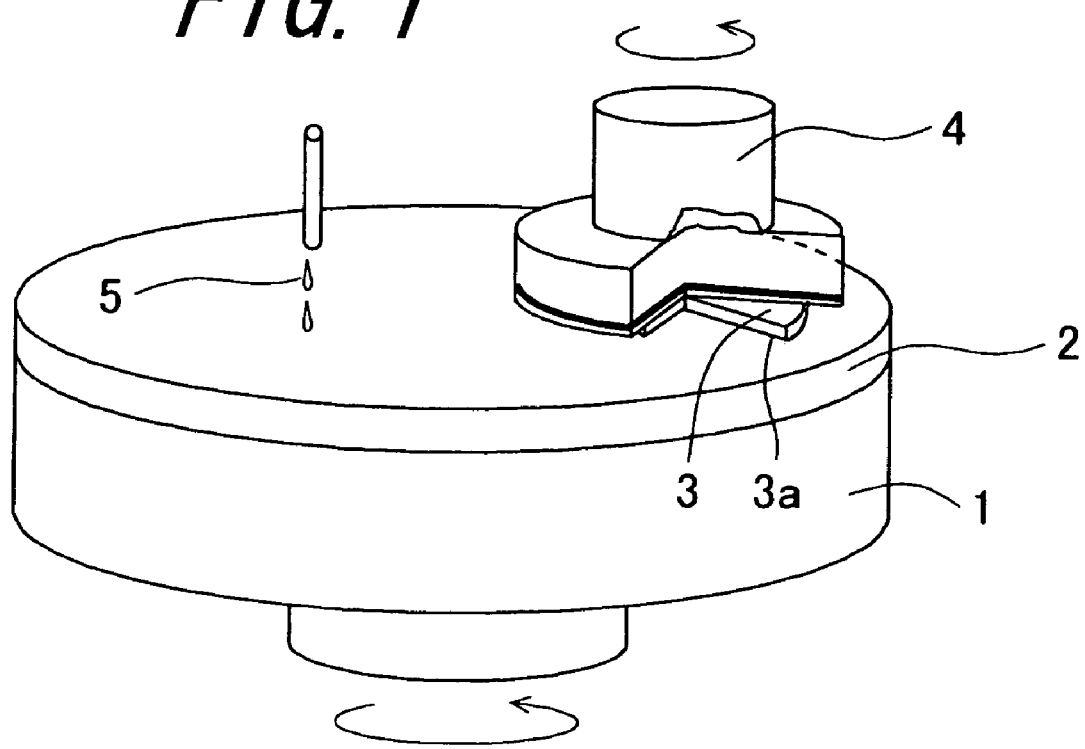

SEMICONDUCTOR POLISHING COMPOSITION

PRIORITY STATEMENT

This application is the national phase under 35 U.S.C. § 371 of PCT International Application No. PCT/JP2005/005768 which has an International filing date of Mar. 28, 2005, which designated the United States of America and which claims priority on Japanese Patent Application number P2004-096849 filed Mar. 29, 2004, the entire contents of which are hereby incorporated herein by reference.

TECHNICAL FIELD

The present invention generally relates to a semiconductor polishing composition.

BACKGROUND ART

At present, a chemical mechanical polishing (CMP) is an indispensable technology for flattening a wafer to achieve high performance and high integration of a semiconductor device.

In the CMP process, a wafer is placed on a pad stuck to a polishing bed so that a surface being polished of a wafer may come into contact with the pad, and, with a pressure head pressed against the wafer to apply a constant weight thereon and with a polishing composition supplying on a pad surface, the pad and the pressure head are rotated to polish the wafer.

The polishing composition is an aqueous slurry in which a polishing agent is dispersed, and, depending on a material of a film formed on a surface being polished of the wafer, an appropriate one is selected from various polishing agents. Among them, a polishing agent made of silica such as colloidal silica and fumed silica is generally used (Japanese Unexamined Patent Publication JP-A 52-47369).

Among the silica base polishing agents, the colloidal silica is excellent in the dispersion stability in water. Accordingly, a polishing composition that is an aqueous dispersion solution of colloidal silica, as far as a concentration of the colloidal silica is in an appropriate range, even after a long storage, is difficult to cause agglomeration of the colloidal silica. However, since the colloidal silica is relatively slow in the polishing speed, there is a problem in that it takes a long time to polish a wafer.

Accordingly, in combination with the colloidal silica, a polishing accelerator such as an organic acid, an oxidizing agent such as hydrogen peroxide, an corrosion inhibitor such as a benzotriazole compound and a surfactant are used. Furthermore, since the colloidal silica is industrially produced from sodium silicate as a raw material and resultantly contains sodium as an impurity, a wafer is likely to be contaminated at the time of polishing.

Accordingly, it becomes necessary to refine colloidal silica to make higher in the purity. Thus, since when the colloidal silica is industrially produced, a refining process to make higher in the purity becomes necessary, the productivity is deteriorated and the producing cost goes up.

On the other hand, fumed silica is faster in the polishing speed than the colloidal silica. In addition, since the fumed silica is synthesized by burning silicon tetrachloride in an oxygen hydrogen flame, the impurity is less contained and the cost is industrially less expensive. However, the fumed silica is insufficient in the aqueous dispersibility.

Accordingly, in a polishing composition that is an aqueous dispersion solution of fumed silica, owing to external loads such as piping load (collision with an inner wall of piping) when supplying to the CMP process, load (pressure owing to a feed pump) of a feed pump, load (pressure load owing to a pressure head) of the pressure head or an environmental condition when conveying, the fumed silica is agglomerated. Furthermore, during the long-term storage, the fumed silica tends to be agglomerated.

The fumed silica enlarged by the agglomeration causes a lot of polishing flaws on the wafer. Such polishing flaws disturb the reliability of the electrical connection of the wafer. Particularly when the polishing flaw that is 0.2 μm or more in diameter is caused more than 100 on one wafer, the wafer becomes a defective product to deteriorate the yield of the polishing step.

In view of high polishing speed of the fumed silica and an advantage in the cost thereof, various technologies have been proposed to improve the aqueous dispersibility of the fumed silica.

For instance, there is a method where water and fumed silica are mixed under application of a high shearing force to obtain an aqueous dispersion solution containing the fumed silica at a high concentration, water is added to the aqueous dispersion solution to dilute, and thereby a polishing composition containing a desired concentration of fumed silica is obtained (refer to, for instance, Japanese Examined Patent Publication JP-B2 2935125).

Furthermore, there is a method where, under application of a high shearing force, acid and fumed silica are sequentially added to water and mixed, water is further added thereto, and an alkali aqueous solution is added thereto to obtain a polishing composition containing fumed silica (refer to, for instance, Japanese Examined Patent Publication JP-B2 2949633).

Still furthermore, there is a method where, to water of pH 2 to 4, under application of a high shearing force, fumed silica is added so that a concentration may be 40 to 60% by weight, water is further added to adjust the viscosity to 2 to 10000 cps, followed by stirring for 5 min or more under application of a low shearing force, further followed by adding water to adjust a concentration of fumed silica to 10 to 38% by weight, still further followed by adding alkali under strong stirring to adjust the pH to 9 to 12, and thereby a polishing composition containing fumed silica is obtained (refer to, for instance, Japanese Unexamined Patent Publication JP-A 2001-26771).

However, the polishing compositions described in JP-B2 2935125, JP-B2 2949633 and JP-A 2001-26771, though improved in the aqueous dispersibility of fumed silica in comparison with existing one, are not yet in a sufficiently satisfying level. Accordingly, under the external load and/or during long storage, the fumed silica is unavoidably agglomerated.

SUMMARY

An object of an embodiment of the invention is to provide a semiconductor polishing composition that is an aqueous dispersion solution of fumed silica and can efficiently polish a semiconductor device such as a wafer at a high polishing speed without causing a polishing flaw.

An embodiment of the invention provides a semiconductor polishing composition comprising:

fumed silica, the semiconductor polishing composition being an aqueous dispersion solution of fumed silica, wherein the number of particles of fumed silica having a particle diameter of 0.5 μm or more is 600,000 pieces/ml or less and the number of particles of fumed silica having a particle diameter of 1 μm or more is 6000 pieces/ml or less.

Furthermore, in the semiconductor polishing composition according to an embodiment of the invention, it is preferable that the semiconductor polishing composition has the number of fumed silica particles that have a particle diameter of 0.5 μm or more in a range of 10,000 to 600,000 pieces/ml (10,000 pieces/ml or more and 600,000 pieces/ml or less).

Still furthermore, in the semiconductor polishing composition according to an embodiment of the invention, it is preferable that the semiconductor polishing composition has the number of fumed silica particles that have a particle diameter of 1 μm or more in a range of 500 to 6000 pieces/ml (500 pieces/ml or more and 6000 pieces/ml or less).

Furthermore, in the semiconductor polishing composition according to an embodiment of the invention, it is preferable that a content of the fumed silica is in a range of 10 to 30% by weight (10% by weight or more and 30% by weight or less) based on a total amount of the composition.

Furthermore, in the semiconductor polishing composition according to an embodiment of the invention, it is preferable that the aqueous dispersion solution of fumed silica is prepared by adding an acidic fumed silica dispersion solution to an alkali aqueous solution.

Still furthermore, in the semiconductor polishing composition according to an embodiment of the invention, it is preferable that a pH of the alkali aqueous solution is in a range of 12 to 14 (12 or more and 14 or less).

BRIEF DESCRIPTION OF DRAWINGS

Other and further objects, features, and advantages of the invention will be more explicit from the following detailed description of the example embodiments taken with reference to the drawings wherein:

FIG. 1 is a view schematically showing an example of the CMP process.

DETAILED DESCRIPTION OF THE EXAMPLE EMBODIMENTS

Now referring to the drawings, example embodiments of the invention are described below.

The polishing composition according to an embodiment of the invention is an aqueous dispersion solution of fumed silica and contains, in 1 ml of the aqueous dispersion solution, 600,000 or less pieces of fumed silica particles having a particle diameter of 0.5 μm or more and 6,000 or less pieces of fumed silica having a particle diameter of 1 μm or more.

When the number of fumed silica particles having a particle diameter of 0.5 μm or more exceeds 600,000 pieces/ml or the number of fumed silica having a particle diameter of 1 μm or more exceeds 6,000 pieces/ml, many polishing flaws are caused on a surface of a semiconductor device.

The number of fumed silica particles having a particle diameter of 0.5 μm or more is preferably in a range of 10,000 to 600,000 pieces/ml, more preferably in a range of 10,000 to 300,000 pieces/ml.

Furthermore, the number of fumed silica particles having a particle diameter of 1 μm or more is preferably in a range of 500 to 6,000 pieces/ml, more preferably in a range of 1,000 to 4,000 pieces/ml.

In the specification, the number of particles in the respective particle diameters of the fumed silica is obtained in such a manner that with 0.5 ml of the polishing composition as a sample, the sample is measured with a particle size analyzer (tradename; Accusizer, manufactured by Particle Sizing Systems Co.,) and a measurement value is doubled to obtain a numerical value per 1 ml.

As the fumed silica that is used in an embodiment of the invention, one which used to be applied in the field can be used. However, in view of the aqueous dispersibility and the polishing speed thereof, an average primary particle diameter thereof is preferably in a range of 1 to 500 nm, more preferably in the range of 5 to 300 nm, particularly preferably in a range of 5 to 80 nm.

Furthermore, a specific surface area of the fumed silica is neither restricted particularly, however, when the aqueous dispersibility and the polishing speed thereof are taken into consideration as well, a specific surface area measured by the BET method is preferably 400 $m^2/g$ or less, more preferably in a range of 50 to 200 $m^2/g$, particularly preferably in a range of 50 to 150 $m^2/g$.

As the fumed silica, two kinds or more of fumed silica different in the average primary particle diameter and/or the specific surface area can be used together.

The fumed silica can be produced through a vapor-phase hydrolysis of silicon tetrachloride in an oxygen hydrogen flame. Furthermore, a method described in JP-A 2000-86227 can be used to produce. According to the publication, a volatile silicon compound is fed together with a mixed gas containing an inflammable gas and oxygen to a burner and combusted at a temperature in the range of 1000 to 2100° C., and, through the pyrolysis of the volatile silicon compound, fumed silica can be produced. Now, examples of the volatile silicon compound include known compounds such as $SiH_4$, $SiCl_4$, $CH_3SiCl_3$, $CH_3SiHCl_2$, $HSiCl_3$, $(CH_3)_2SiCl_2$, $(CH_3)_3SiCl$, $(CH_3)_2SiH_2$, $(CH_3)_3SiH$ and alkoxysilanes.

Among these, volatile silicon compounds containing a halogen atom are preferable. The volatile silicon compounds can be used singularly or in a combination of two or more thereof. As the inflammable gas, one that forms water owing to the combustion in the presence of oxygen is preferable. For instance, hydrogen, methane and butane can be cited. In place of oxygen, air can be used. A mixing ratio of the volatile silicon compound and the mixed gas is appropriately selected depending on the kind of the inflammable gas contained in the mixed gas. For instance, when the inflammable gas is hydrogen, to one mol of the volatile silicon compound, about 2.5 to 3.5 mol of oxygen and about 1.5 to 3.5 mol of hydrogen may be used.

In an embodiment of the invention, commercially available fumed silica can be used as well. Specific examples thereof include AEROSIL 90G and AEROSIL 130 (trade name, manufactured by Nippon Aerosil Co., Ltd.).

A content of the fumed silica in the polishing composition of an embodiment of the invention, without restricting to particular one, can be appropriately selected from a wide range depending on an average primary particle diameter and a specific surface area thereof. However, in view of maintaining the aqueous dispersibility at a high level over a long term and obtaining a high polishing speed, the content of the fumed silica is preferably in the range of 10 to 30% by weight, more preferably in the range of 10 to 28% by weight based on a total amount of the polishing composition.

The polishing composition according to an embodiment of the invention, within an extent that does not damage the aqueous dispersibility of the fumed silica, can contain general additives such as a polishing accelerator, an oxidizing agent, an organic acid, a complexing agent, a corrosion inhibitor and a surfactant.

As the polishing accelerator, for instance, piperazines, primary amine compounds having 1 to 6 carbon atoms and quaternary ammonium salts can be cited. Examples of the piperazines include piperazine, anhydrous piperazine, piperazine hexahydrate, N-aminoethyl piperazine and 1,4-bis(3- aminopropyl)piperazine. Examples of the primary amine compound having 1 to 6 carbon atoms include α-oxyethyl amine (α-aminoethyl alcohol), monoethanol amine (β-aminoethyl alcohol), aminoethylethanolamine, triethylenetetramine and ethylene diamine. Examples of the quaternary ammonium salt include tetramethylammonium chloride, tetramethylammonium hydroxide, dimethyldiethylammonium chloride, N,N-dimethyl morpholinium sulfate and tetrabutylammonium bromide.

The polishing accelerators can be used singularly or in a combination of two or more thereof. A content of the polishing accelerator in the polishing composition of the invention, without particular restriction, is preferably in the range of about 10 to 30% by weight based on a total amount of the polishing composition.

Examples of the oxidant include potassium iodate, periodic acid, potassium iodide and iodic acid. The oxidants can be used singularly or in a combination of two or more thereof. A content of the oxidant in the polishing composition of an embodiment of the invention, without particular restriction, is preferably in the range of about 0.01 to 20% by weight based on a total amount of the polishing composition.

Examples of the organic acid include monocarboxylic acids having 2 to 6 carbon atoms such as formic acid, acetic acid, propionic acid, butyric acid, valeric acid and lactic acid; dicarboxylic acids having 2 to 6 carbon atoms such as oxalic acid, malonic acid, succinic acid, tartaric acid, malic acid and fumaric acid; tricarboxylic acids having 3 to 6 carbon atoms such as citric acid and isocitric acid; aromatic carboxylic acids such as salicylic acid; and ascorbic acid.

In the organic acids, salts of the carboxylic acids and ascorbic acid are contained as well. The organic acids can be used singularly or in a combination of two or more thereof. A content of the organic acid in the polishing composition of an embodiment of the invention, without particular restriction, is preferably in the range of about 0.005 to 5% by weight based on a total amount of the polishing composition.

Examples of the complexing agent include ethylenediaminetetraacetic acid (EDTA), hydroxyethylethylenediaminetriacetic acid (HEDTA), diethylenetriaminepentaacetic acid (DTPA), nitrilotriacetic acid (NTA), triethylenetetraminehexaacetic acid (TTHA), hydroxyethyliminodiacetic acid (HIDA), dihydroxyethylglycine (DHEG), ethylene glycol-bis(β-aminoethylether)-N, N'-tetraacetic acid (EGTA) and 1,2-diaminocyclohexane-N, N, N', N'-tetraacetic acid (CDTA).

The complexing agents can be used singularly or in a combination of two or more thereof. A content of the complexing agent in the polishing composition of the invention, without particular restriction, is preferably in the range of about 0.005 to 5% by weight based on a total amount of the polishing composition.

As the corrosion inhibitors, for instance, benzotriazole, tolyltriazole, benzotriazole-4-carboxylic acid and alkyl ester thereof, naphtotriazole and a derivative thereof, imidazole, quinaldic acid and invar derivative can be cited. The corrosion inhibitors can be used singularly or in a combination of two or more thereof. A content of the corrosion inhibitor in the polishing composition of an embodiment of the invention, without particular restriction, is preferably in the range of about 0.005 to 0.5% by weight based on a total amount of the polishing composition.

Examples of surfactant include anionic surfactants such as polyacrylic acid salt, alkylbenzene sulfonate, alkane sulfonate and α-olefinsulfonate; and nonionic surfactants such as fatty acid monoethanol amide, fatty acid diethanol amide, fatty acid ethylene glycol ester, monofatty acid glycerin ester, fatty acid sorbitan ester, fatty acid sucrose ester, alkylpolyoxyethylene ether, polyvinyl pyrrolidone, polyvinyl alcohol, hydroxyethyl cellulose, carboxymethyl cellulose and polyethylene glycol. The surfactants can be used singularly or in a combination of two or more thereof. A content of the surfactant in the polishing composition of an embodiment of the invention, without particular restriction, is preferably about 0.1% by weight or less, more preferably in the range of about 0.001 to 0.1% by weight based on a total amount of the polishing composition.

Furthermore, the polishing composition according to an embodiment of the invention, within a range that does not damage preferable characteristics thereof, may contain alcohols. When alcohols are added, the dissolution stability of, for instance, the polishing accelerator can be improved. As the alcohols, aliphatic saturated alcohols having 1 to 6 carbon atoms are preferable. Specific examples thereof include linear or branched chain aliphatic saturated alcohol having 1 to 6 carbon atoms such as methanol, ethanol, propanol, isopropanol, butanol, isobutanol, tert-butanol, pentanol and hexanol.

The alcohols may have a substituent such as a hydroxyl group in an alkyl portion. The alcohols can be used singularly or in a combination of two or more thereof. A content of the alcohols in the polishing composition of the invention, without particular restriction, is preferably in the range of about 0.01 to 5% by weight based on a total amount of the polishing composition.

The polishing composition according to the invention can be produced by use of a method that includes for instance (1) through (5) steps below.

(1) Step of Preparing Acidic Aqueous Solution

In the step, an acidic aqueous solution is prepared. The acidic aqueous solution can be prepared by adding acid to water. Known acids can be used and examples thereof include inorganic acids such as hydrochloric acid, nitric acid and sulfuric acid and organic acids such as phosphoric acid. Among these, the inorganic acid is preferable and hydrochloric acid is particularly preferable. The acids can be used singularly or, as needs arise, in a combination of two or more thereof.

The pH of the acidic aqueous solution is preferably in the range of 1.0 to 3.0, more preferably in the range of 1.0 to 2.7, particularly preferably 2.

(2) Step of Mixing Acidic Aqueous Solution and Fumed Silica

In the step, the acidic aqueous solution and the fumed silica are mixed to prepare an acidic fumed silica dispersion solution. At the mixing thereof, a high shearing force is preferably applied. A mixing time is not particularly restricted. However, 1 hr or more is preferable and 2 hr or more is more preferable.

A concentration of the fumed silica in the acidic fumed silica dispersion solution is, though not particularly restricted, preferably in the range of 40 to 60% by weight, more preferably in the range of 46 to 54% by weight to an entire dispersion solution.

(3) Step of Diluting Acidic Fumed Silica Dispersion Solution

In the step, water is added to the acidic fumed silica dispersion solution to dilute the concentration of the fumed silica in the dispersion solution preferably to 30 to 45% by weight, more preferably to 33 to 44% by weight.

At that time, the dispersion solution is preferably diluted not by one-time addition of water but by a plurality of times of additions of water to gradually dilute to a desired concentration. About two to four times of additions of water are particularly preferable.

For instance, to the acidic fumed silica dispersion solution, water of an amount that reduces the concentration of the fumed silica by 1% by weight is added, followed by mixing for about 10 to 40 min. Subsequently, water of an amount that reduces the concentration of the fumed silica to a desired concentration is added, followed by mixing for about 30 min to 4 hr. At the mixing, a shearing force is preferably applied.

A mixing time after water is added to the acidic fumed silica dispersion solution, without restricting to the above-mentioned ones, can be appropriately selected depending on a degree of dilution. Normally, as the degree of dilution becomes larger, the mixing time is preferably made longer.

(4) Step of Preparing Alkali Aqueous Solution

In the step, an alkali aqueous solution is prepared. The alkali aqueous solution can be prepared by adding alkali to water. Known alkalis can be used and examples thereof include alkali metal hydroxides such as ammonium hydroxide, sodium hydroxide and potassium hydroxide; and alkaline earth metal hydroxides such as calcium hydroxide, barium hydroxide and magnesium hydroxide. Among these, ammonium hydroxide and alkali metal hydroxides are preferable and potassium hydroxide is more preferable. The alkalis may be used singularly or in a combination of two or more as needs arise.

To the alkali aqueous solution, one or two or more general additives such as a polishing accelerator, an oxidant, an organic acid, a complexing agent, a corrosion inhibitor and a surfactant can be added.

The pH of the alkali aqueous solution is preferably in the range of 12 to 14.

(5) Step of Preparing Polishing Composition

In the step, a polishing composition of an embodiment of the invention is prepared.

The acidic fumed silica dispersion solution is added to the alkali aqueous solution and mixed, and thereby a polishing composition of an embodiment of the invention can be prepared.

At the mixing, the acidic fumed silica dispersion solution is necessarily added to the alkali aqueous solution. By contrast, when the alkali aqueous solution is added to the acidic fumed silica dispersion solution, the aqueous dispersibility of the fumed silica is deteriorated; accordingly, a desired polishing composition cannot be obtained.

Furthermore, at the mixing, since the alkali aqueous solution is strongly alkaline and the acidic fumed silica dispersion solution is strongly acidic, when the acidic fumed silica dispersion solution is gradually added over a long time to the alkali aqueous solution, the fumed silica tends to be agglomerated. Accordingly, depending on a concentration of the fumed silica in the acidic fumed silica dispersion solution, it is preferably added so as not to cause agglomeration. More preferably, it is well to carry out so that the acidic fumed silica dispersion solution may be added to the alkali aqueous solution within 5 hr.

A mixing ratio of the acidic fumed silica dispersion solution and the alkali aqueous solution is not particularly restricted. The acidic fumed silica dispersion solution and the alkali aqueous solution only need to be mixed so that the pH of the polishing composition becomes preferably in the range of 8 to 12 and a concentration of the fumed silica may be preferably in the range of 10 to 30% by weight.

Thus obtained polishing composition, as needs arise, can be subjected to classification. A classification process is preferably carried out with 1 μm particle trap filter. The 1 μm particle trap rate of the filter is preferably 99% or more, more preferably 99.5% or more, particularly preferably 99.9% or more. Such a 1 μm particle trap filter can be commercially available. For instance, Profile 2 (trade name, manufactured by Nippon Pall Co., Ltd., 1 μm filter, trap rate of 1 μm particles: 99.99%) and Polypro-klean (trade name, manufactured by CUNO Incorporated, 1 μm filter, trap rate of 1 μm particles: 99.99%) can be cited. A classification process, except that the 1 μm particle trap filter is used, similarly to an existing classification process that uses a filter, can be applied. For instance, an aqueous dispersion solution of fumed silica, under normal pressure, reduced pressure or pressure, only needs be passed through the 1 μm particle trap filter.

Thus polishing composition of the invention can be obtained.

Water that is used to prepare the polishing composition of an embodiment of the invention is not particularly restricted; however, in view of the applications, ultrapure water, pure water, ion-exchanged water and distilled water are preferably used.

Furthermore, in the above method, a polishing composition in which a content of the fumed silica is higher than the above range is prepared, and, when the polishing composition is used to polish, it may be appropriately diluted with water to use. Even when a content of the fumed silica is increased, when a classification process is applied and a fumed silica concentration is appropriately diluted (preferably in the range of 10 to 30% by weight of a total composition) at the polishing, the number of particles having a particle diameter of 0.5 μm or more and the number of particles having a particle diameter of 1 μm or more can be controlled in the specified range.

When a semiconductor wafer is polished with the polishing composition of an embodiment of the invention, except that, in place of an existing polishing composition, the polishing composition of an embodiment of the invention is used, the polishing can be carried out similarly as ever.

For instance, as shown in FIG. 1, on a pad 2 stuck to a polishing bed 1, a semiconductor wafer 3 is disposed so that a surface being polished of the semiconductor wafer 3 may come into contact with the pad 2, and while a pressure head 4 is pressed against the semiconductor wafer 3 to apply a constant load to the semiconductor wafer 3 and a polishing composition 5 of an embodiment of the invention is being fed on a surface of the pad 2, the pad 2 and the pressure head 4 are rotated to polish the semiconductor wafer 3. At that time, a feed amount of the polishing composition of an embodiment of the invention, without being restricted particularly, can be appropriately selected from a wide range depending on various conditions such as a kind of thin film to be polished, applied pressure and a material of the pad and preferably in the range of 10 to 1000 ml/min.

The polishing composition of an embodiment of the invention can be used as a polishing composition generally in the CMP processing of a wafer. Specifically, the polishing composition can be preferably used to polish a wafer having a thin film formed thereon. The thin film formed on the wafer includes: a film of a metal such as W, Cu, Ti and Ta; a film of ceramics such as TiN, TaN and $Si_3N_4$; a film of oxide such as $SiO_2$ and p-TEOS; and a low dielectric film such as a HSQ film, a methylated HSQ film, a SiLK film and a porous film. Particularly, the polishing composition can be preferably used to polish a film of oxide.

Furthermore, the polishing composition of an embodiment of the invention, without restricting to the CMP polishing of the semiconductor wafer, can be preferably used when, in the applications other than the above-mentioned applications, metals and ceramics are polished.

EXAMPLES

In what follows, with reference to Examples, Comparative Examples and Test Examples, the invention will be specifically described.

Example 1

Preparation of Acidic Fumed Silica Dispersion Solution

To ultrapure water, a 0.01N hydrochloric acid aqueous solution was added and the pH was adjusted to 2. To the hydrochloric acid aqueous solution, fumed silica (average primary particle diameter: 20 nm and specific surface area: 90 $m^2/g$) was added followed by stirring for 2 hr 30 min, and thereby an acidic fumed silica dispersion solution of which fumed silica concentration is 50% by weight was prepared.

Dilution of Acidic Fumed silica Dispersion Solution

To the acidic fumed silica dispersion solution, ultrapure water was added followed by mixing for 30 min. Thereby, an acidic fumed silica dispersion solution of which fumed silica concentration is 49% by weight was obtained.

Furthermore, to the acidic fumed silica dispersion solution of which fumed silica concentration is 49% by weight, ultra-pure water was added followed by mixing for 1 hr. Thereby, an acidic fumed silica dispersion solution of which fumed silica concentration is 40% by weight was obtained. The pH of the dispersion solution was 2.

The mixings all were carried out under application of a shearing force with a high-shearing dispersion unit (trade name: HIVIS DISPER, manufactured by Tokushu Kika Kogyo Co., Ltd.).

Preparation of Alkali Aqueous Solution

To ultrapure water, a 0.8% by weight potassium hydroxide aqueous solution was added to prepare an alkali aqueous solution of pH 13.

Preparation of Polishing Composition of at least one Embodiment of the Invention To 26.3 kg of the alkali aqueous solution, 43.7 kg of the acidic fumed silica dispersion solution of which concentration of the fumed silica is 40% by weight was added under stirring, followed by further mixing for 0.1 hr after the completion of the addition, and thereby a polishing composition of an embodiment of the invention was prepared.

The obtained polishing composition was filtered with a filter of which 1 μm particle trap rate is 99.99% (trade name: Profile 2 1 μm Filter, manufactured by Nippon Pall Co., Ltd.) to remove coarse particles, and thereby a polishing composition of an embodiment of the invention, in which a fumed silica concentration is 25% by weight was prepared.

Example 2

Except that, in place of the filter of which 1 μm particle trap rate is 99.99%, a filter of which 1 μm particle trap rate is 99.5% (trade name: Profile 2 2 μm Filter, manufactured by Nippon Pall Co., Ltd.) was used, similarly to Example 1, a polishing composition of an embodiment of the invention, in which a fumed silica concentration is 25% by weight was prepared.

Comparative Example 1

Except that, in place of the filter of which 1 μm particle trap rate is 99.99%, a filter of which 1 μm particle trap rate is 95% (trade name: Profile 2 3 μm Filter, manufactured by Nippon Pall Co., Ltd.) was used, similarly to Example 1, a polishing composition of Comparative Example 1, in which a fumed silica concentration is 25% by weight was prepared.

Comparative Example 2

A polishing composition was prepared in accordance with Example 1 of JP-B2 2935125, followed by filtering with a filter having the filtration accuracy of 5 μm. The obtained polishing composition of Comparative Example 2 had an average particle diameter of fumed silica of 120 nm, a fumed silica concentration of 25% by weight and the pH of 11.

Comparative Example 3

A polishing composition was prepared in accordance with Example 1 of JP-B2 2949633, followed by filtering with a filter having the filtration accuracy of 10 μm. The obtained polishing composition of Comparative Example 3 had an average particle diameter of fumed silica of 120 nm, a fumed silica concentration of 25% by weight and the pH of 11.

Comparative Example 4

A polishing composition was prepared in accordance with Example 1 of JP-A2001-26771, followed by filtering with a filter having the filtration accuracy of 3 μm. The obtained polishing composition of Comparative Example 4 had an average particle diameter of fumed silica of 131 nm, a fumed silica concentration of 12.5% by weight and the pH of 10.5.

Test Example 1

From each of the polishing compositions according to Examples 1 and 2 and Comparative Examples 1 through 4, 0.5 ml was sampled and, with a particle size analyzer (trade name: Accusizer 780APS, manufactured by Particle Sizing Systems Co.,), the number of fumed silica particles having a particle diameter of 0.5 μm or more and the number of fumed silica particles having a particle diameter of 1.0 μm or more in each of the compositions were measured. Each of the compositions of Examples 1 and 2 and Comparative Example 3 was measured twice and each of the compositions according to Comparative Examples 2 through 4 was measured once. The measurement value was doubled to obtain the number of particles in 1 ml. Results are shown in Table 1.

Test Example 2

With each of the polishing compositions according to Example 1 and 2 and Comparative Examples 1 through 4, a semiconductor wafer was polished under the conditions below.

[Polishing Conditions]
Silicon wafer: 8"-PTEOS, manufactured by Advantec Co.,
Polishing device: trade name SH-24, manufactured by SpeedFam Inc.,
Polishing pad: trade name IC1400A2, 050 K-Grv. 24"P9H Rotation speed of polishing bed: 60 rpm
Rotation speed of pressure head: 41 rpm
Surface pressure of polishing load: about $4.83 \times 10^4$ Pa (7 psi)
Flow rate of semiconductor polishing composition: 100 ml/min
Polishing time: 60 sec A surface of a polished semiconductor wafer was observed with a wafer surface inspection device to check the number of polishing flaws having a diameter of 0.2 µm or more per one semiconductor wafer. With each of the polishing compositions, the polishing test was repeated three times. Results are shown in Table 1.

TABLE 1

|  |  | Number of Particles having a particle diameter of 0.5 µm or more (pieces) | Number of Particles having a particle diameter of 1.0 µm or more (pieces) | Number of Polishing Flaws having a diameter of 0.2 µm or more (pieces) |
| --- | --- | --- | --- | --- |
| Example 1 | First Time | 124,348 | 1,506 | 21 |
|  | Second Time | 189,808 | 2,154 | 24 |
| Example 2 | First Time | 431,246 | 4,096 | 31 |
|  | Second Time | 548,652 | 5,548 | 37 |
| Comparative Example 1 | First Time | 699,574 | 7,000 | 53 |
|  | Second Time | 824,688 | 8,710 | 59 |
| Comparative Example 2 | First Time | 911,642 | 11,638 | 250 |
| Comparative Example 4 | First Time | 17,950,906 | 3,231,962 | 342 |

The polishing composition of Comparative Example 3 showed values substantially same as that of the polishing composition of Comparative Example 2. Accordingly, these were omitted from showing.

From Table 1, it is obvious that while, in the polishing compositions of Examples 1 and 2, the number of polishing flaws having a magnitude of 0.2 µm or more in diameter does not reach 50 pieces, in the polishing compositions of Comparative Examples 1 through 4, the polishing flaws largely exceeding 100 pieces are generated. In order to secure the reliability of the electrical connection of a wafer, the number of the polishing flaws 0.2 µm or more in diameter is demanded to be less than 100 pieces. Accordingly, when the polishing compositions of Examples 1 and 2 are used, the number of generations of the polishing flaw can be largely reduced more than ever, and thereby an excellent polishing composition having remarkably excellent flattening property can be obtained.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

INDUSTRIAL APPLICABILITY

According to at least one embodiment of the invention, a semiconductor polishing composition (hereinafter, unless clearly stated, simply referred to as "polishing composition") that is an aqueous dispersion solution of fumed silica and where the number of particles of fumed silica having a particle diameter of 0.5 µm or more is 600,000 pieces/ml or less and the number of particles of fumed silica having a particle diameter of 1 µm or more is 6000 pieces/ml or less is provided.

The polishing composition of at least one embodiment of the invention is very slightly agglomerated owing to external load and/or long-term storage. Accordingly, when the polishing composition is used to polish a semiconductor device, the polishing flaws are hardly generated on the semiconductor device; accordingly, after the polishing of the semiconductor device, the reliability in the electrical connection can be further improved. In addition, the semiconductor device can be efficiently polished (flattened) at a high polishing speed. Accordingly, the yield of the polished semiconductor device can be improved to improve the production efficiency.

The particle size distribution is effective to improve the aqueous dispersibility of the fumed silica and is not necessarily effective, when the particle size distribution is applied to other silica particles such as colloidal silica, to improve the aqueous dispersibility thereof.

Furthermore, according to an embodiment of the invention, in a polishing composition of the invention, a content of fumed silica based on a total amount of the polishing composition is preferably in the range of 10 to 30% by weight, more preferably in the range of 10 to 28% by weight. When a content of the fumed silica is within the range, the aqueous dispersibility thereof is particularly excellent.

Furthermore, according to an embodiment of the invention, the polishing composition according to the invention is preferably produced by adding an acidic fumed silica dispersion solution to an aqueous alkali solution, followed by blending.

At this time, the pH of the aqueous alkali solution is preferably set in the range of 12 to 14. When the pH is thus controlled, the polishing composition according to an embodiment of the invention can be readily produced.

The invention claimed is:

1. A semiconductor polishing composition comprising: fumed silica, the semiconductor polishing composition being an aqueous dispersion solution of fumed silica, wherein the number of particles of fumed silica having a particle diameter of 0.5 µm or more is in a range of 10,000 to 600,000 pieces/ml and the number of particles of fumed silica having a particle diameter of 1 µm or more is in a range of 500 to 6000 pieces/ml.

2. The semiconductor polishing composition of claim 1, wherein a content of the fumed silica is in a range of 10 to 30% by weight based on a total amount of the composition.

3. The semiconductor polishing composition of claim 1, wherein the aqueous dispersion solution of fumed silica is prepared by adding an acidic fumed silica dispersion solution to an alkali aqueous solution.

4. The semiconductor polishing composition of claim 3, wherein a pH of the alkali aqueous solution is in a range of 12 to 14.

* * * * *